(12) United States Patent
Burney

(10) Patent No.: US 7,715,467 B1
(45) Date of Patent: May 11, 2010

(54) PROGRAMMABLE LOGIC DEVICE INTEGRATED CIRCUIT WITH DYNAMIC PHASE ALIGNMENT CAPABILITIES

(75) Inventor: Ali Burney, Fremont, CA (US)

(73) Assignee: Altera Corporation, San Jose, CA (US)

( * ) Notice: Subject to any disclaimer, the term of this patent is extended or adjusted under 35 U.S.C. 154(b) by 635 days.

(21) Appl. No.: 11/488,434

(22) Filed: Jul. 17, 2006

Related U.S. Application Data

(60) Provisional application No. 60/790,282, filed on Apr. 7, 2006.

(51) Int. Cl.
*H04B 1/38* (2006.01)
(52) U.S. Cl. .................................................. 375/219
(58) Field of Classification Search ................. 375/219
See application file for complete search history.

(56) References Cited

U.S. PATENT DOCUMENTS

| | | | | |
|---|---|---|---|---|
| 6,650,140 | B2 * | 11/2003 | Lee et al. ....................... | 326/39 |
| 6,724,328 | B1 * | 4/2004 | Lui et al. ...................... | 341/101 |
| 6,973,151 | B2 * | 12/2005 | Lysdal et al. ................. | 375/371 |
| 6,985,096 | B1 | 1/2006 | Sasaki et al. | |
| 7,003,423 | B1 * | 2/2006 | Kabani et al. ............... | 702/120 |
| 7,034,597 | B1 * | 4/2006 | Mo et al. ..................... | 327/276 |
| 7,075,365 | B1 | 7/2006 | Starr et al. | |
| 7,340,021 | B1 * | 3/2008 | Churchill et al. ............ | 375/354 |
| 7,493,461 | B1 * | 2/2009 | Thorne ......................... | 711/167 |
| 7,515,664 | B1 * | 4/2009 | Yeoh ............................ | 375/354 |
| 2001/0033188 | A1 | 10/2001 | Aung et al. | |
| 2004/0032282 | A1 * | 2/2004 | Lee et al. ...................... | 326/39 |
| 2004/0258410 | A1 * | 12/2004 | Yajima et al. ................. | 398/71 |
| 2005/0117517 | A1 * | 6/2005 | DeCusatis et al. ........... | 370/235 |
| 2006/0250882 | A1 * | 11/2006 | Choi et al. .................... | 365/233 |
| 2006/0256909 | A1 * | 11/2006 | On et al. ....................... | 375/376 |

OTHER PUBLICATIONS

Baetoniu, "High Speed Data Recovery Using Asynchronous Data Capture Techniques", XAPP671, Jan. 7, 2005, pp. 1-12, (v1.1), Xilinx.*
Yeoh, "Dynamic Phase Alignment for Networking Applications", XAPP700, Dec. 7, 2004, pp. 1-15, (v1.1), Xilinx.*

(Continued)

*Primary Examiner*—Juan A Torres
(74) *Attorney, Agent, or Firm*—Treyz Law Group; G. Victor Treyz; Nancy Y. Ru

(57) ABSTRACT

Adjustable transceiver circuitry is provided for programmable integrated circuits such as programmable logic device integrated circuits. The transceiver circuitry has a dynamic phase alignment circuit that can be used for aligning clock and data signals. The dynamic phase alignment circuit contains a bypassable synchronizer. Four modes of operation are supported by the transceiver circuitry including a normal source synchronous mode, a normal dynamic phase alignment mode, a soft clock data recovery mode, and a phase-locked-loop source synchronous mode. In normal source synchronous mode, the dynamic phase alignment circuit performs no phase alignment or clock rate matching. In normal dynamic phase alignment mode, the dynamic phase alignment circuit performs only phase alignment operations. In soft clock data recovery mode, programmable logic on the programmable integrated circuit is configured to perform rate matching and phase alignment. In phase-locked-loop source synchronous mode, phase alignment and board level deskewing operations are performed.

21 Claims, 7 Drawing Sheets

OTHER PUBLICATIONS

Baetoniu, "Dynamic Phase Alignment Using Asynchronous Data Capture", XAPP 697 (v1.2) Jan. 7, 2005, Xilinx.*

Altera, "Stratix GX FPGA Family", Dec. 2004 ver 2.2 this document can be found at http://www.altera.com/literature/ds/ds_sgx.pdf document authored by the Applicant.*

Altera, "The evolution of high-speed transceiver technology", Nov. 2002, this document can be found at http://www.altera.com/literature/wp/wp_hs_transceiver.pdf, document auhtored by the Applicant.*

Venkata, "Multi-protocol embedded PCS IP in a FPGA-SOC", Proceedings of the IEEE 2005 Custom Integrated Circuits Conference, 2005 21-21 Sep. 2005 pp. 783-786.*

Venkata, "Architecture and methodology of a SoPC with 3.25Gbps CDR based SERDES and 1Gbps dynamic phase alignment", Proceedings of the IEEE 2003 Custom Integrated Circuits Conference, Sep. 21-24, 2003 pp. 659-662.*

Altera, "Implementing 10 Gigabit Ethernet XAUI in Stratix GX Devices" Nov. 2002, this document can be found at http://www.altera.ru/Disks/Altera%20Documentation%20Library/literature/an/an249.pdf document authored by the Applicant.*

Altera "Stratix GX FPGA Family", Mar. 2003, this document can be found at http://datasheet.digchip.com/033/ds_sgx.pdf document authored by the Applicant.*

Altera "Stratix GX FPGA Family", Feb. 2004, this document can be found at http://www.unizar.es/euitiz/areas/aretecel/docencia/microel/hojas/stratix_gx.pdf document authored by the Applicant.*

Altera "Stratix GX FPGA Family", Nov. 2003, this document can be found at http://www.altera.ru/Disks/Altera%20Documentation%20Library/literature/ds/ds_sgx.pdf document authored by the Applicant.*

Altera "Stratix GX Transceiver User Guide", Jan. 2005, this document http://www.altera.com/literature/ug/ug_sgx.pdf document authored by the Applicant.*

"Stratix II GX Transceiver Block Overview" Stratix II GX Device Handbook, vol. 2, pp. 1-1 to 1-8, Altera Corporation, Feb. 2006.

"Stratix II BX Physical Coding Sub-Layer", pp. 1-3 printed from www.altera.com on Mar. 21, 2006, Altera Corporation.

"Stratix II GX Transceiver FPGAs Physical Medium Attachment Layer", pp. 1 and 2, printed from www.altera.com on Mar. 21, 2006, Altera Corporation.

"Source Synchronous Signaling in Stratix II Devices", pp. 1 and 2, printed from www.altera.com on Mar. 21, 2006, Altera Corporation.

* cited by examiner

PROGRAMMABLE LOGIC DEVICE INTEGRATED CIRCUIT WITH DYNAMIC PHASE ALIGNMENT CAPABILITIES

This application claims the benefit of provisional patent application No. 60/790,282, filed Apr. 7, 2006, which is hereby incorporated by reference herein in its entirety.

BACKGROUND

This invention relates to integrated circuits such as programmable logic device integrated circuits, and more particularly, to programmable logic device integrated circuits with dynamic phase alignment circuits.

Programmable logic devices are a type of integrated circuit that can be programmed by a user to implement a desired custom logic function. In a typical scenario, a logic designer uses computer-aided design tools to design a custom logic circuit. When the design process is complete, the tools generate configuration data. The configuration data is loaded into a programmable logic device to configure the device to perform the functions of the custom logic circuit.

In a typical system, a programmable logic device integrated circuit and other integrated circuits are mounted on a circuit board. The circuit board contains conductive paths that interconnect the integrated circuits. A system may also have paths that interconnect integrated circuits on different boards. Programmable logic devices contain transceiver circuitry for transmitting and receiving data over these communications paths.

Programmable logic device transceiver circuitry includes input and output drivers. The input and output drivers may use differential signaling schemes in which a pair of signals are referenced to each other or single-ended signaling schemes, in which signals are referenced to ground. In high-speed environments, the input and output drivers are generally differential drivers and handle differential signals.

In some programmable logic device architectures, complex transceiver circuitry is provided that supports many different operating modes. High-speed signals are handled by relying extensively on hardwired logic. While this type of arrangement may be satisfactory for some logic designs, the inclusion of complex transceiver circuitry is unnecessary for some designs and adds needless overhead. As a result, other programmable logic device architectures forgo complex transceiver circuitry and only support limited transceiver functionality such as source synchronous input-output signaling standards. Although these architectures dedicate less hardwired circuitry to processing incoming and outgoing data signals, they do not allow circuit designers to benefit from the different operating modes available with more complex transceiver architectures.

It would therefore be desirable to be able to provide integrated circuits such as programmable logic device integrated circuits with transceiver circuitry that supports a number of different operating modes without requiring the dedication of complex hardwired resources.

SUMMARY

In accordance with the present invention, integrated circuits such as programmable logic device integrated circuits are provided with adjustable transceiver circuitry. The adjustable transceiver circuitry has a hardwired portion including an adjustable dynamic phase alignment circuit and a portion that is selectively implemented from programmable logic.

The transceiver circuitry has a dynamic phase alignment circuit that can be used for aligning clock and data signals. The dynamic phase alignment circuit contains a bypassable synchronizer. Multiplexers are used to route clock and data signals during different modes of operation. The modes of operation that are supported by the transceiver circuitry include a normal source synchronous mode, a normal dynamic phase alignment mode, a soft clock data recovery mode, a slave synchronous phase-locked-loop source synchronous mode, and a master synchronous phase-locked-loop source synchronous mode.

In normal source synchronous mode, the dynamic phase alignment circuit performs no phase alignment or clock rate matching. The synchronizer in the dynamic phase alignment circuit is not needed and is therefore bypassed.

In normal dynamic phase alignment mode, the dynamic phase alignment circuit uses the synchronizer to perform phase alignment operations.

In soft clock data recovery mode, programmable logic on the programmable integrated circuit is configured to implement a rate matching first-in-first-out (FIFO) circuit. The FIFO circuit performs rate matching and phase alignment. Because phase alignment is performed using the FIFO, the synchronizer in the dynamic phase alignment circuit is not needed and is bypassed.

In the phase-locked-loop source synchronous modes, dynamic phase alignment circuits are organized in groups having a master dynamic phase alignment circuit and multiple slave dynamic phase alignment circuits. This architecture allows phase-locked-loop circuit resources to be conserved.

Further features of the invention, its nature and various advantages will be more apparent from the accompanying drawings and the following detailed description of the preferred embodiments.

DETAILED DESCRIPTION

The present invention relates to integrated circuits containing programmable transceivers. The transceiver circuits contain hardwired circuitry and may contain programmable circuitry. The programmable circuitry in the transceiver is programmed to perform a custom transceiver function using configuration data. With one suitable arrangement, the transceiver is programmed by loading configuration data into volatile memory elements such as random-access-memory (RAM) cells.

The integrated circuits used with the present invention may be programmable logic device integrated circuits or programmable integrated circuits that contain programmable circuitry but that are not typically referred to as programmable logic devices. For example, the invention may be used with digital signal processing circuits containing programmable circuitry, microprocessors containing programmable circuitry, application specific integrated circuits containing programmable circuitry, or any other suitable integrated circuit. The present invention will generally be described in the context of programmable logic device integrated circuits and programmable logic device transceiver circuitry as an example.

Figure 1:
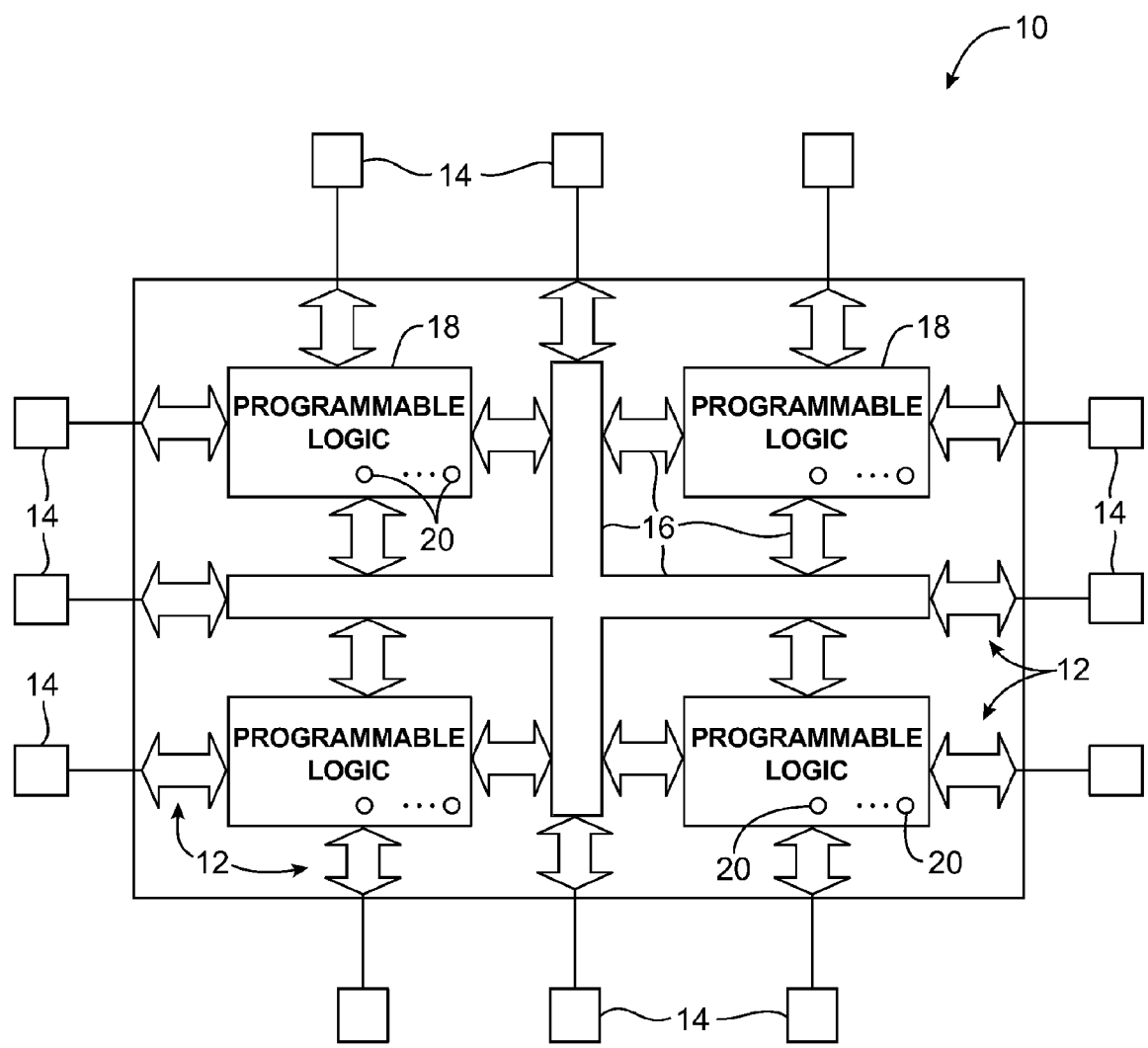
FIG. 1 is a diagram of an illustrative programmable logic device in accordance with the present invention.

An illustrative programmable logic device 10 in accordance with the present invention is shown in FIG. 1. Programmable logic device 10 may have input/output circuitry 12 for driving signals off of device 10 and for receiving signals from other devices via input/output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. For example, programmable logic 18 may include look-up tables, registers, and multiplexers. The programmable logic 18 may be configured to perform a custom logic function. The programmable interconnects associated with interconnection resources may be considered to be a part of programmable logic 18.

Programmable logic devices contain programmable elements 20. Some programmable logic devices are programmed by configuring their programmable elements 20 using mask programming arrangements. A mask-programmed device is configured during semiconductor manufacturing. Other programmable logic devices are configured after semiconductor fabrication operations have been completed (e.g., using electrical programming or laser programming to program their programmable elements). In general, programmable elements 20 may be based on any suitable programmable technology, such as fuses, antifuses, electrically-programmable read-only-memory technology, random-access memory cells, mask-programmed elements, etc.

Most programmable logic devices are electrically programmed. With electrical programming arrangements, the programmable elements 20 may be formed from memory cells. During programming, configuration data is loaded into the memory cells 20 using pins 14 and input/output circuitry 12. Most commonly, memory cells 20 are random-access-memory (RAM) cells. The use of memory cells 20 based on RAM technology is described herein as an example. Because the RAM cells are loaded with configuration data, they are sometimes referred to as configuration RAM cells (CRAM).

Memory cells 20 each provide a corresponding static control output signal that controls the state of an associated logic component in programmable logic 18. The output signals are typically applied to the gates of metal-oxide-semiconductor (MOS) transistors.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

Figure 2:
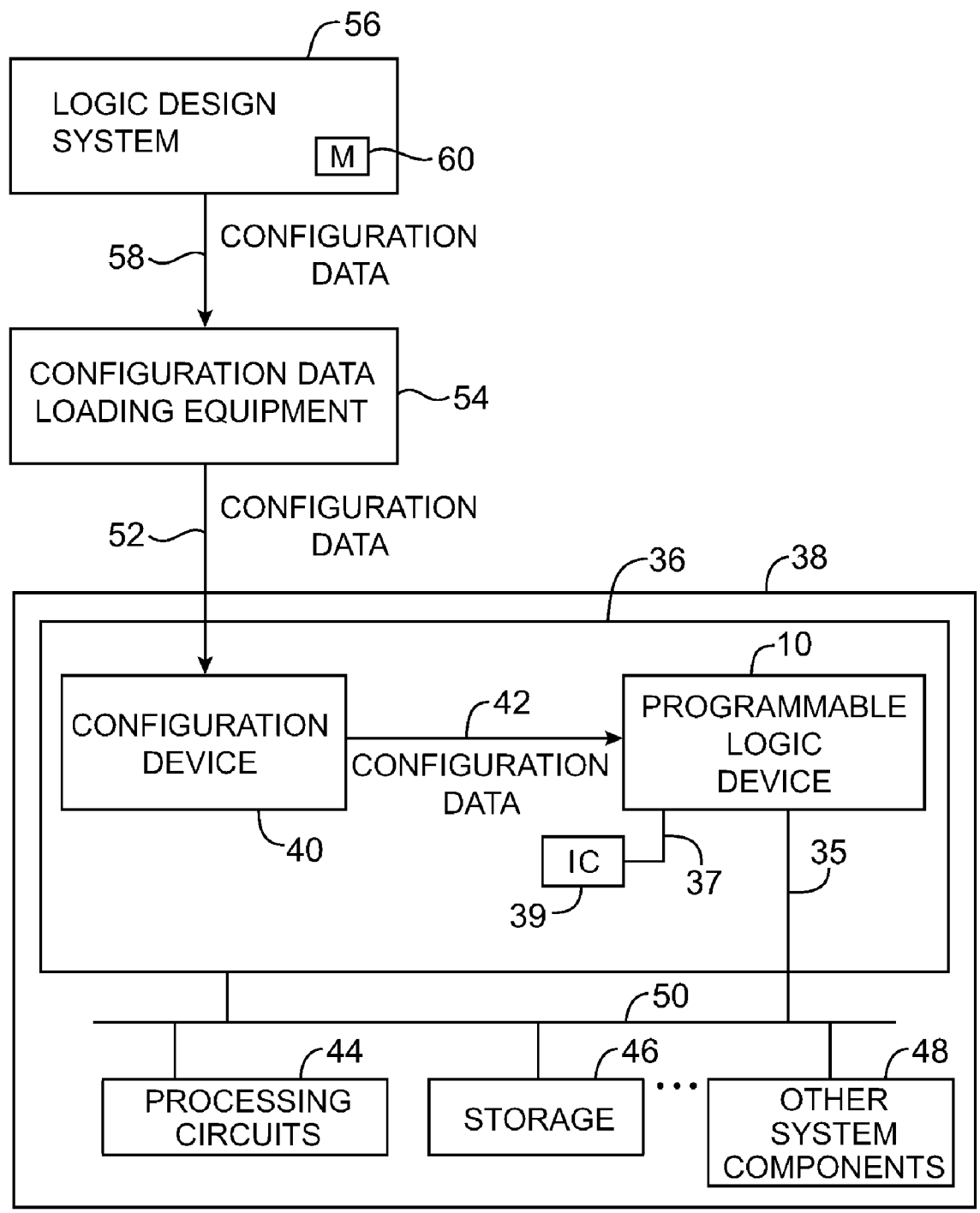
FIG. 2 is a diagram showing how programmable logic device configuration data is created by a logic design system and loaded into a programmable logic device to configure the device for operation in a system in accordance with the present invention.

An illustrative system environment for a programmable logic device 10 is shown in FIG. 2. Programmable logic device 10 may be mounted on a board 36 in a system 38. Programmable logic device 10 may receive configuration data from programming equipment or from any other suitable equipment or device. In the example of FIG. 2, programmable logic device 10 is the type of programmable logic device that receives configuration data from an associated integrated circuit 40. With this type of arrangement, circuit 40 may, if desired, be mounted on the same board 36 as programmable logic device 10. The circuit 40 may be an erasable-programmable read-only memory (EPROM) chip, a programmable logic device configuration data loading chip with built-in memory (sometimes referred to as a configuration device), or any other suitable device. When system 38 boots up (or at another suitable time), the configuration data for configuring the programmable logic device may be supplied to the programmable logic device from device 40, as shown schematically by path 42. The configuration data that is supplied to the programmable logic device may be stored in the programmable logic device in its configuration random-access-memory elements 20.

System 38 may include processing circuits 44, storage 46, and other system components 48 that communicate with device 10. The components of system 38 may be located on one or more boards such as board 36 or other suitable mounting structures or housings. As shown in the example of FIG. 2, communications paths are used to interconnect device 10 to other components. For example, communications path 37 is used to convey data between an integrated circuit 39 that is mounted on board 36 and programmable logic device 10. Communications paths 35 and 50 are used to convey signals between programmable logic device 10 and components 44, 46, and 48.

Configuration device 40 may be supplied with the configuration data for device 10 over a path such as path 52. Configuration device 40 may, for example, receive the configuration data from configuration data loading equipment 54 or other suitable equipment that stores this data in configuration device 40. Device 40 may be loaded with data before or after installation on board 36.

It can be a significant undertaking to design and implement a desired logic circuit in a programmable logic device. Logic designers therefore generally use logic design systems based on computer-aided-design (CAD) tools to assist them in designing circuits. A logic design system can help a logic designer design and test complex circuits for a system. When a design is complete, the logic design system may be used to generate configuration data for electrically programming the appropriate programmable logic device.

As shown in FIG. 2, the configuration data produced by a logic design system 56 may be provided to equipment 54 over a path such as path 58. The equipment 54 provides the configuration data to device 40, so that device 40 can later provide this configuration data to the programmable logic device 10 over path 42. System 56 may be based on one or more computers and one or more software programs. In general, software and data may be stored on any computer-readable medium (storage) in system 56 and is shown schematically as storage 60 in FIG. 2.

In a typical scenario, logic design system 56 is used by a logic designer to create a custom circuit design. The system 56 produces corresponding configuration data which is provided to configuration device 40. Upon power-up, configuration device 40 and data loading circuitry on programmable logic device 10 is used to load the configuration data into the CRAM cells 20 of device 10. Device 10 may then be used in normal operation of system 38.

Figure 3:
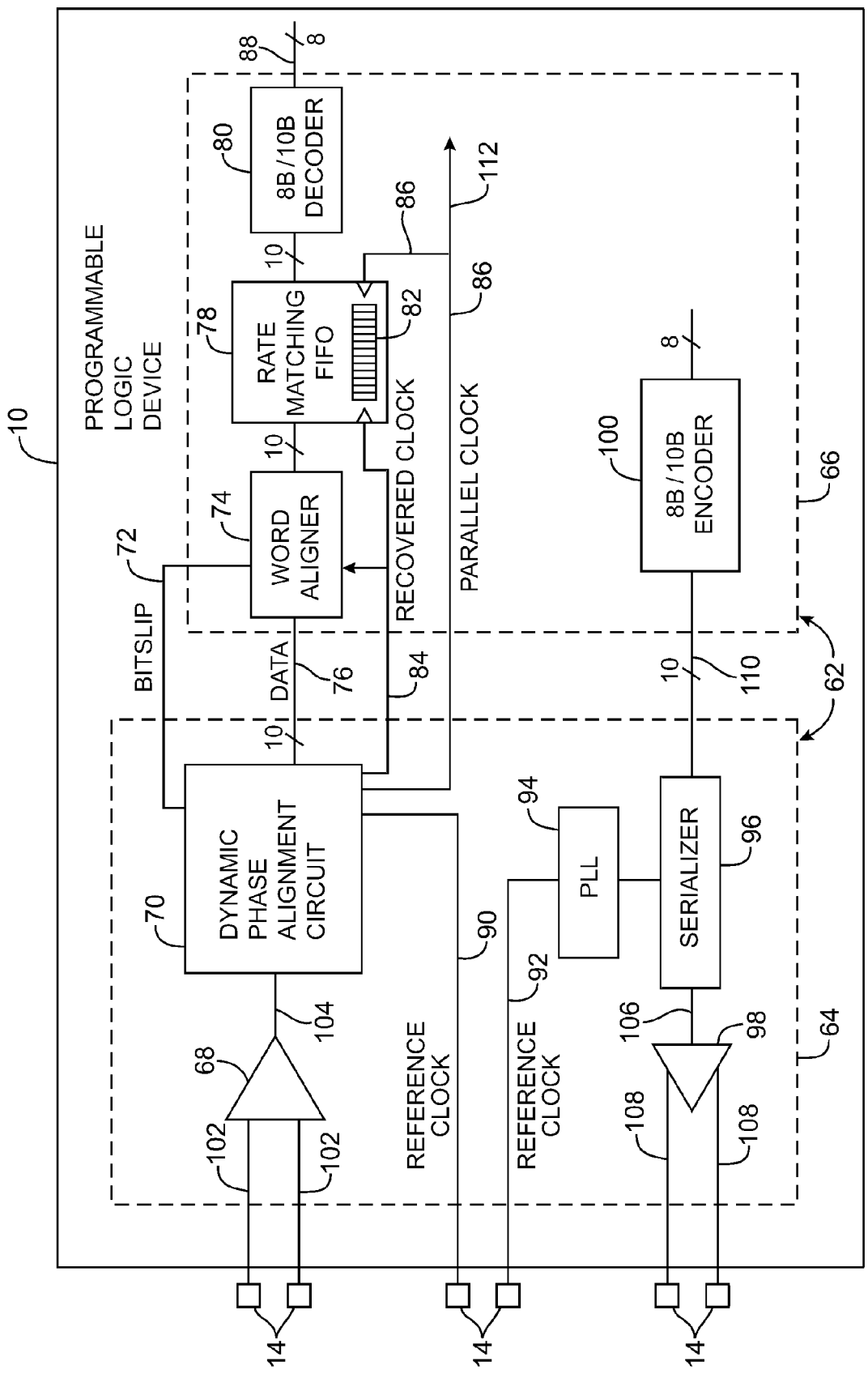
FIG. 3 is a diagram of illustrative programmable logic device integrated circuit transceiver circuitry in accordance with the present invention.

As shown in FIG. 3, programmable logic device 10 contains transceiver circuitry 62. Transceiver circuitry 62 handles high-speed serial data. In a typical scenario, there may be transceiver circuitry for tens or hundreds of different channels. The transceiver circuitry shown in FIG. 3 handles input data and output data for a single channel.

Transceiver 62 includes circuit 64 and circuit 66.

Circuit 64, which is sometimes referred to as a transceiver physical medium attachment layer, contains dedicated circuitry for handling high-speed signals. For example, circuit 64 includes high-speed analog circuitry such as input buffer 68 and output buffer 98. Input buffer 68 converts differential input signals received on inputs 102 into a single-ended signal on line 104. Output buffer 98 converts single-ended signals on line 106 into differential signals on lines 108. The differential signals on lines 102 and 108 are conveyed over differential signal paths such as paths 37, 35, and 50 of FIG. 2.

Circuit 64 also contains a hardwired dynamic phase alignment circuit 70 that processes the input data on line 104. Dynamic phase alignment circuit 70 receives a reference clock on line 90. The reference clock received on line 90 has a single phase. Dynamic phase alignment circuit 70 generates a multiphase clock signal based on the single-phase reference clock. The multiphase clock signal may, as an example, have sixteen separate phases. Because the multiphase clock is used by the dynamic phase alignment circuit 70, the multiphase clock is sometimes referred to as a dynamic phase alignment (DPA) clock. The DPA clock has a rate that is typically an integral multiple of the rate of the reference clock, so that the DPA clock is nominally matched to the data rate of the input data on path 104. For example, the input data that is received may have a data rate of 1250 Mbps, whereas the reference clock may have a frequency of 125 MHz. In this scenario, the DPA alignment circuit produces a DPA clock that is ten times faster than the reference clock (i.e., a DPA clock running at 1250 MHz).

During processing of input data on line 104, the dynamic phase alignment circuit 70 determines which of the sixteen phases of the DPA clock signal produces optimum results when clocking in the input data 104. The dynamic phase alignment circuit 70 selects the optimum phase of the DPA clock and uses the selected phase to receive input data from line 104. After performing serial-to-parallel conversion, the dynamic phase alignment circuit 70 supplies the input data to circuit 66 on parallel data path 76. The dynamic phase alignment circuit 70 also supplies clock signals RECOVERED CLOCK and PARALLEL CLOCK to circuit 66.

Output data is handled using phase-locked loop circuit 94, serializer 96, and output buffer 98. Phase-locked loop circuit 94 receives a reference clock on path 92 and produces a corresponding clock for controlling serializer 96. Serializer 96 receives data from circuit 66. In a typical scenario, an 8B/10B encoder 100 that receives data from programmable logic on device 10 provides digital data to serializer 96 over ten parallel data lines 110. Serializer 96 converts this parallel data to a serial data stream on line 106. Output buffer 98 drives the single-ended serial data on line 106 onto differential data lines 108. The output data is then transmitted to a receiving integrated circuit.

Circuit 66, which is sometimes referred to as a soft physical coding sublayer, is preferably implemented from programmable logic 18. Because programmable logic resources are used in implementing the circuit 66, it is not necessary to dedicate hardware resources for circuit 66. In circuit designs that do not require the transceiver circuitry 66 in some or all I/O channels, programmable logic resources that would otherwise not be available are freed for use in implementing other circuitry.

Dynamic phase alignment circuit 70 contains a deserializer. The deserializers convert serial data on line 104 into parallel data on path 76 (e.g., parallel data on ten parallel lines). Dynamic phase alignment circuit 70 also contains a phase-locked-loop circuit that locks onto the reference clock. The phase-locked-loop circuit contains a clock multiplier that produces a multiphase DPA clock from the reference clock (e.g., a multiphase DPA clock at ten times the rate of the reference clock). The phase-locked-loop circuit also produces a slower clock (e.g., at the reference clock rate). The slower clock is used to process parallel data in device 10 and is therefore sometimes referred to as a parallel clock. The phase-locked-loop circuit also produces a serial clock that is phase-aligned with the parallel clock and that has the same rate as the DPA clock. A clock divider in the dynamic phase alignment circuit 70 divides the selected phase of the DPA clock to produce a slower clock signal that is sometimes referred to as the recovered clock.

The recovered clock is provided to word aligner 74 via path 84. Word aligner 74 monitors incoming data for a match with a known data pattern (e.g., idle characters in an 8B/10B encoding scheme). Word aligner 74 generates a control signal BITSLIP on line 72 that directs a data realigner circuit in circuit 70 to selectively drop incoming bits when needed to maintain word alignment in the input data. Word-aligned data is provided to rate matching first-in-first-out (FIFO) circuit 78.

Programmable logic 18 on device 10 processes data that is provided on path 88 after 8B/10B decoding by 8B/10B decoder 80. The programmable logic uses the parallel reference clock that is derived from the reference clock on line 90 by dynamic phase alignment circuit 70. The parallel reference clock is distributed to the programmable logic using paths such as path 86 and path 112.

Rate matching FIFO 78 contains a FIFO register formed from registers 82 in programmable logic 18 (e.g., a bank of 20 registers that are connected together during device programming to form a 20-register-deep FIFO). The rate matching FIFO circuit 78 ensures that the incoming data that has been processed by dynamic phase alignment circuit 70 using the selected phase of the DPA clock is phase and rate matched to the programmable logic on device 10, which is using the parallel clock on path 86.

Rate matching FIFO circuit 78 contains an idle character generator for generating idle characters. Rate matching is accomplished by adding idle characters to the data stream from the idle character generator or by deleting idle characters as needed. Data is written into FIFO 78 using the recovered clock signal on path 84. Data is read out of FIFO 78 using the parallel clock 86. The phase-matched and rate-matched output data from rate matching FIFO 78 is provided to 8B/10B decoder 80 for decoding. If desired, encoding schemes such as 8B/10B decoding need not be used and decoder 80 and encoder 100 can be omitted.

Figure 4:
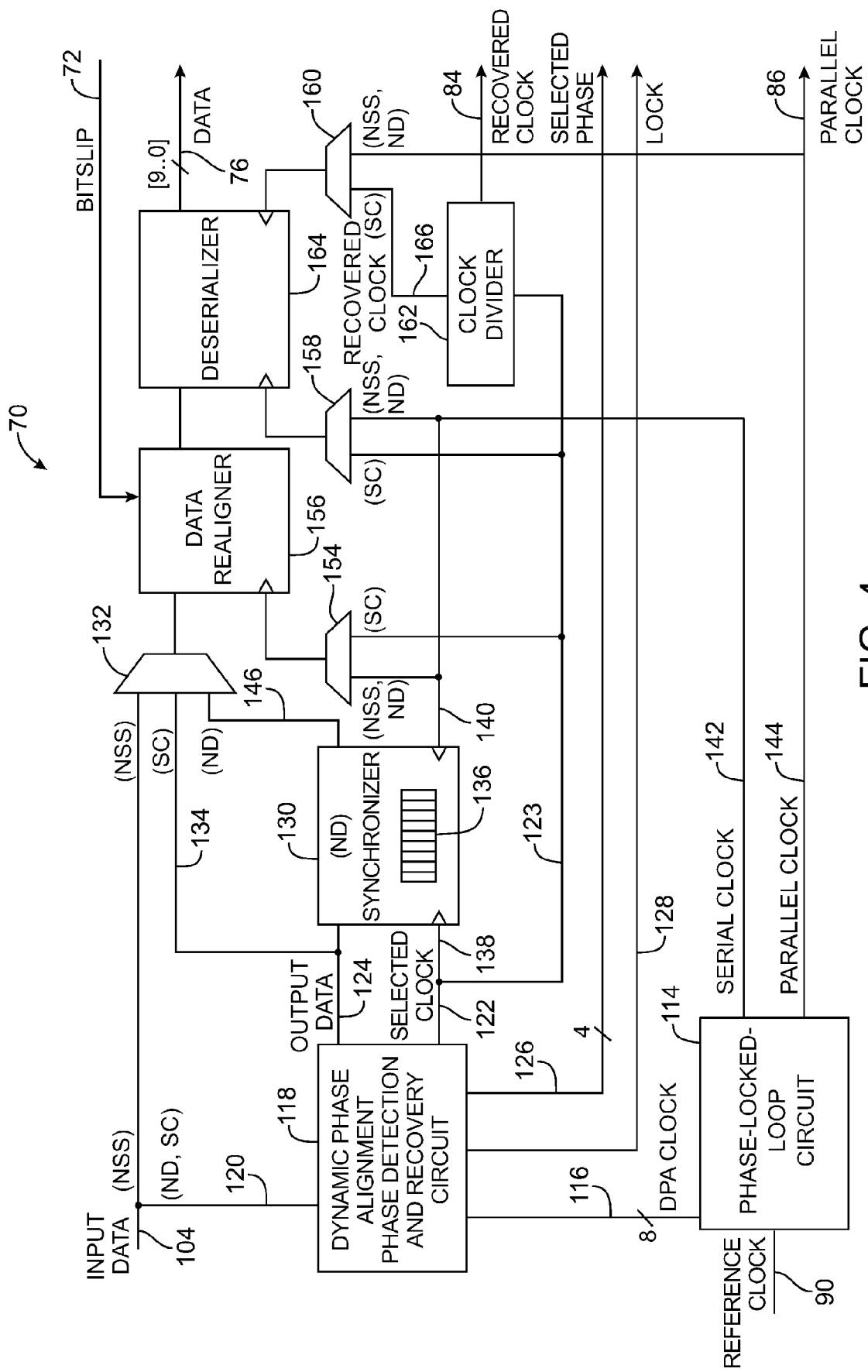
FIG. 4 is a diagram of an illustrative dynamic phase alignment circuit in an illustrative programmable logic device integrated circuit transceiver in accordance with the present invention.

An illustrative dynamic phase alignment circuit 70 that may be used in programmable logic device 10 of FIG. 3 is shown in FIG. 4. As shown in FIG. 4, dynamic phase alignment circuit 70 contains a phase-locked-loop circuit 114. Phase-locked-loop circuit 114 receives a reference clock on path 90 and generates a corresponding multiphase clock signal on path 116. The multiphase clock signal on path 116 generally has a frequency that is an integral multiple of the reference clock frequency, so that the multiphase clock signal matches the input data rate. For example, if the reference clock has a frequency of 125 MHz and the input data rate is 1250 Mbps, the multiphase clock may have a frequency of 1250 MHz. The multiphase clock signal on path 116 preferably has eight phases, each of which is shifted with respect to the other by one-eighth of a clock cycle. The eight-phase clock on path 116 is used for dynamic phase alignment and is therefore sometimes referred to as a dynamic phase alignment (DPA) clock.

The eight phases of the DPA clock are provided to dynamic phase alignment phase detection and recovery circuit 118. Circuit 118 preferably includes interpolation circuitry that converts the eight-phase DPA clock on line 116 into a more fine-grained sixteen-phase DPA clock. There are preferably numerous circuits 118 on programmable logic device 10 (e.g., there are circuits 118 for separate rows of logic array blocks). By localizing the generation of the sixteen-phase DPA clock within the circuits 118, the circuit real estate that is needed for path 116 is minimized, because only eight lines are needed in the path 116 instead of sixteen. If desired, a different number of phases may be generated in each circuit 18 (e.g., more than sixteen or fewer than sixteen).

The DPA phase detection and recovery circuit 118 receives input data from input 104 via path 120. Control circuitry in circuit 118 is used to determine which of the sixteen phases of the DPA clock signal produces optimum results when processing input data from input 104. The selected phase of the DPA clock is provided on output line 122 as the signal SELECTED CLOCK. The rising edge of the signal SELECTED CLOCK is aligned with the center of the input data pulses.

The DPA phase detection and recovery circuit 118 provides a LOCK signal on path 128 that indicates when the DPA phase detection and recovery circuit 118 has successfully identified the optimum phase of the sixteen-phase DPA clock to use in processing incoming data. The identity of the selected clock phase (e.g., number 13 out of 16) is provided using a four-bit SELECTED PHASE signal on line 126. The SELECTED PHASE signal may be used by user logic on device 10. DPA phase detection and recovery circuit 118 operates continuously as data is received by device 10. During operation, the selected phase of the DPA clock may be updated as needed. Because a sixteen-phase DPA clock is used, updates to the selected phase are less likely to result in data errors than if a less fine-grained DPA clock (e.g. an eight-phase clock) were used.

Figure 5:
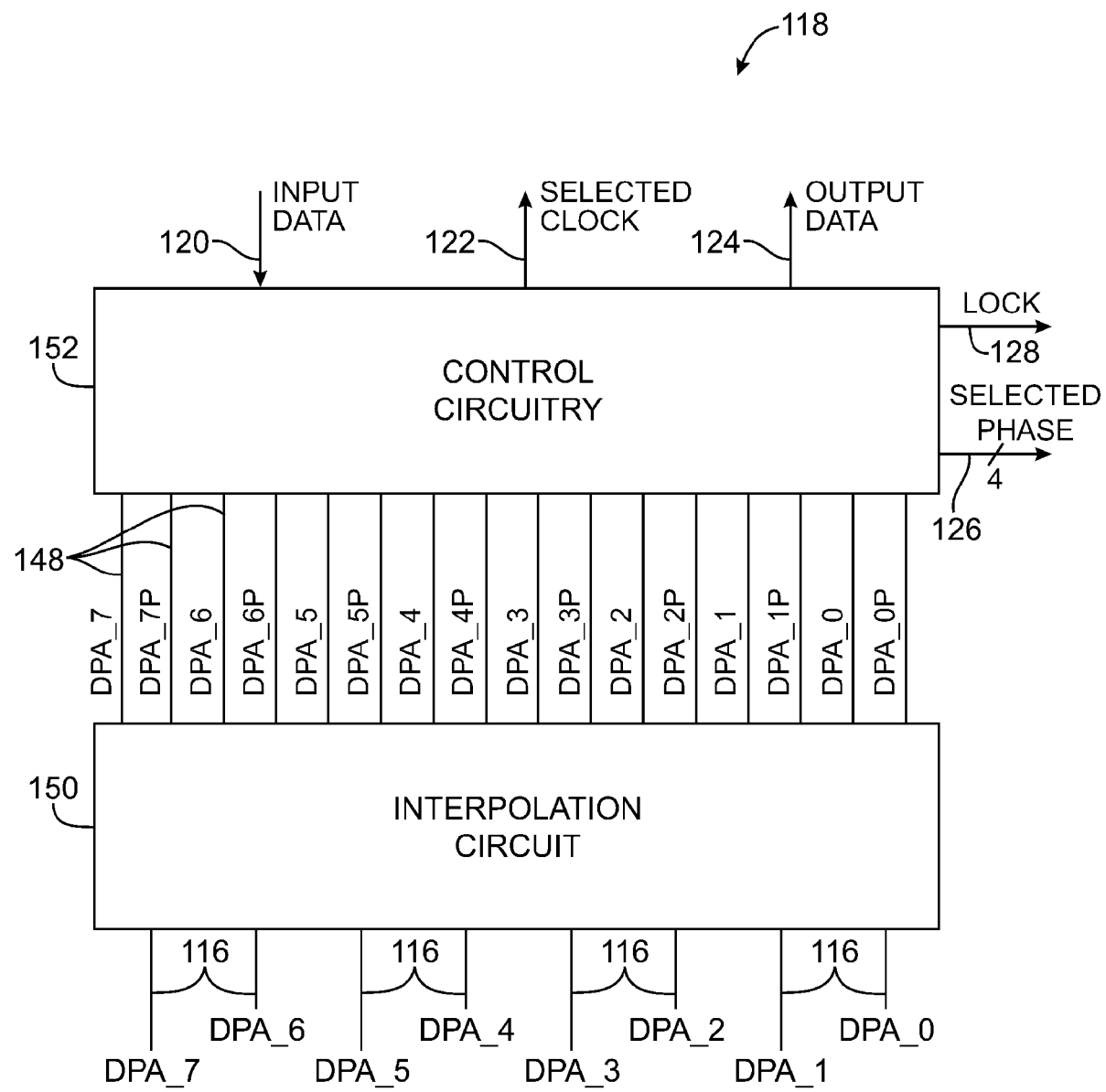
FIG. 5 is a circuit diagram of illustrative dynamic phase alignment phase detection and recovery circuitry of the type that may be used in the illustrative transceiver of FIG. 4 in accordance with the present invention.

An illustrative dynamic phase alignment phase detection and recovery circuit 118 is shown in FIG. 5. As shown in FIG. 5, eight phases of DPA clock are received by interpolation circuit 150 via input lines 116. Interpolation circuit 150 produces a corresponding sixteen-phase DPA clock signal on paths 148. Each of the sixteen phases of the DPA clock is shifted by one-sixteenth of a clock cycle with respect to the next. Control circuitry 152 receives input data on line 120 and selects the optimum phase of the DPA clock for processing this data. The optimum phase is provided as the SELECTED CLOCK signal on line 122 and has its leading edge aligned with the center of the input data pulses.

As shown in FIG. 4, data that has been received and processed by circuit 118 using SELECTED CLOCK is output on line 124 as output data. This output data can be routed to synchronizer 130 and, via path 134, to multiplexer 132.

Synchronizer 130 contains a hardwired first-in-first-out (FIFO) circuit 136 (e.g., a FIFO constructed from a hardwired set of eight registers). The synchronizer ensures that the output data from dynamic phase alignment phase detection and recovery circuit 118 that is received on path 124 is phase-aligned with the clock signals SERIAL CLOCK and PARALLEL CLOCK on lines 142 and 144.

The signal SERIAL CLOCK is produced by the phase-locked-loop circuit 114 based on the reference clock and may have the same rate as the DPA clock on path 116. The signal PARALLEL CLOCK is slower than the SERIAL CLOCK signal and is used for processing parallel data on device 10. In a typical scenario, the signal SERIAL CLOCK is an integer multiple of PARALLEL CLOCK (e.g., PARALLEL CLOCK may be one tenth of SERIAL CLOCK, one eight of SERIAL CLOCK, etc.). The signals SERIAL CLOCK AND PARALLEL CLOCK are phase aligned.

Data is written into the FIFO 136 in synchronizer 130 using the SELECTED CLOCK signal applied using path 138. Data is read from FIFO 136 using the SERIAL CLOCK signal applied using path 140. Data that has been phase aligned with the signal SERIAL CLOCK (and which is therefore phase aligned with PARALLEL CLOCK) is provided to multiplexer 132 via path 146.

Data from the output of multiplexer 132 is provided to data realigner 156. Data realigner 156 receives a control signal BITSLIP from word aligner 74 (FIG. 3). When needed to maintain word alignment in the input data stream, word aligner 74 drops data bits (e.g., idle character bits) from the input data.

Deserializer 164 performs serial-to-parallel data conversion on the data received from data realigner 156. The amount of serial-to-parallel conversion that is produced is preferably adjustable (i.e., deserializer 164 is a 1:N deserializer where valid deserialized data is output on N of the output lines 76). Clock divider 162 is used to divide the signal SELECTED CLOCK by an appropriate integer (e.g., 2, 4, 5, 6, 8, or 10). For example, if deserializer 164 produces N parallel data signals on output lines 76, clock divider 162 may divide the signal SELECTED CLOCK by N to produce the signal RECOVERED CLOCK on lines 84 and 166.

Multiplexers 132, 154, 158, and 160 are adjusted to configure the circuit 70 for proper operation in one of several modes of operation. Circuitry such as multiplexers 132, 154, 158, and 160, clock divider 162, deserializer 164, and phase-locked-loop 114 (which contains an adjustable clock multiplier) can be controlled by static control signals at the outputs of suitable configuration random-access-memory cells 20 or can be controlled by dynamic control signals (e.g., dynamic control signals from external pins or received from core logic in the programmable logic 18 of device 10). By adjusting the circuitry of FIG. 4 and by selectively implementing the circuitry 66 of FIG. 3 from programmable logic resources available on the programmable logic device 10, a user can operate the transceiver 62 in a desired mode of operation.

Figure 6:
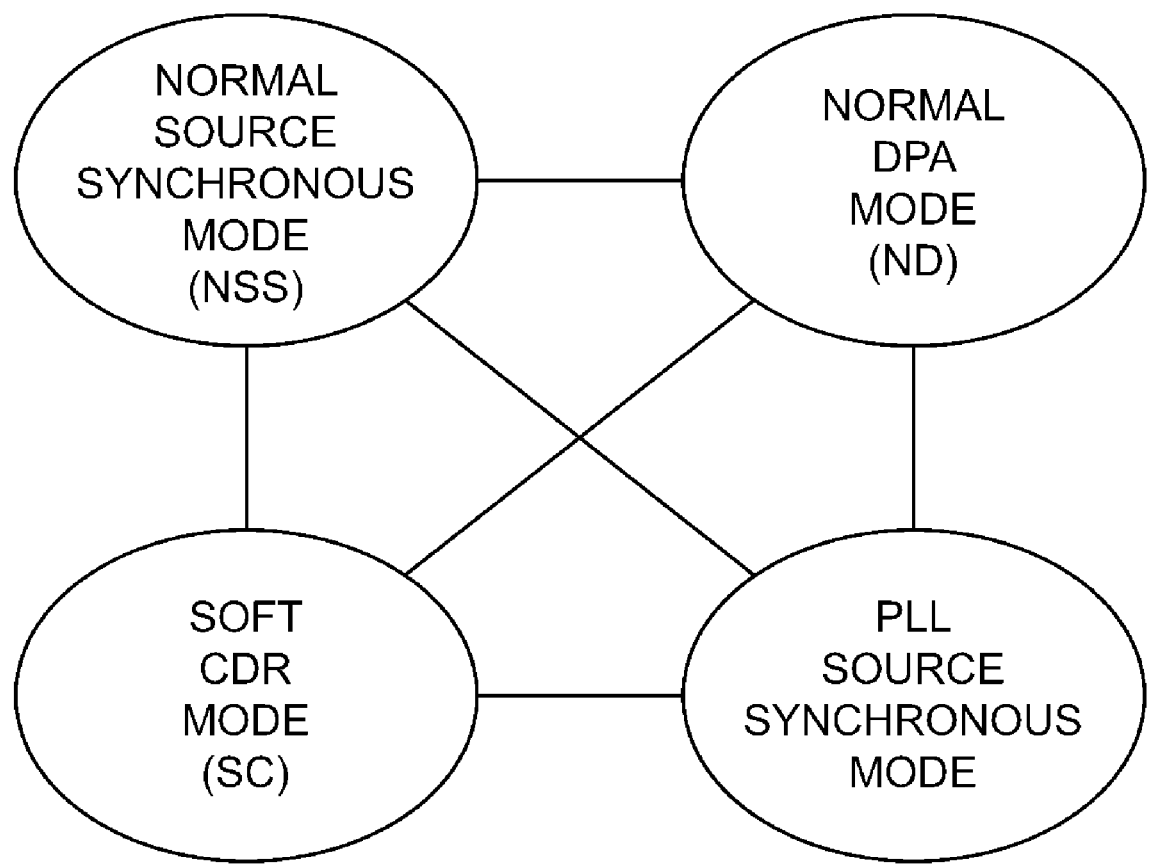
FIG. 6 is a state diagram showing illustrative modes of operation for the transceiver circuitry in accordance with the present invention.

Modes of operation that are supported by DPA circuit 70 are shown in the state diagram of FIG. 6. The modes include: normal source synchronous mode (NSS), normal dynamic phase alignment mode (ND), soft clock data recovery mode (SC), and slave synchronous and master synchronous phase-locked-loop source synchronous modes. Paths in the diagram of FIG. 4 are labeled "NSS," "ND," and "SC," as appropriate to show which paths are active in each of these modes.

In normal source synchronous (NSS) mode, there is no rate matching or phase alignment performed by the transceiver 62. This is because in source synchronous mode the reference clock on device 10, which is serving as a receiver clock, is exactly matched to the clock on the transmitting integrated circuit. This situation may arise, for example, when a single oscillator crystal is used to clock both the transmitting integrated circuit and the receiving integrated circuit. Because there is no mismatch between the transmitting and receiving clocks, there is no need for synchronizer 130. Synchronizer 130 is therefore bypassed by routing data from input 104 through the NSS input of multiplexer 132, as shown in FIG. 4. Multiplexer 154 is used to route the signal SERIAL CLOCK to the clock input of data realigner 156. Multiplexer 158 is used to route the SERIAL CLOCK signal to the serial clock input of deserializer 164. The signal REFERENCE CLOCK is forwarded on lines 114 and 86 by phase-locked-loop circuit 114 as the signal PARALLEL CLOCK (sometimes referred to as the forwarded clock). The forwarded clock may be used by downstream user logic on device 10. Multiplexer 160 is used to route the signal PARALLEL CLOCK to the parallel clock input of deserializer 164. Deserializer 164 performs serial-to-parallel conversion on the data received from data realigner 156 and provides parallel output data to circuit 66 (FIG. 3) via path 76.

In normal dynamic phase alignment mode (ND), there is no rate difference between the transmitter clock and the receiver clock, as with the normal source synchronous situation. However, in normal dynamic phase alignment mode, the transceiver 62 uses synchronizer 130 to perform phase alignment. During the dynamic phase alignment mode, input data is received by dynamic phase alignment phase detection and recovery circuit 118 via path 120. The DPA clock is provided to circuit 118 via path 116. Circuit 118 selects the optimal DPA clock phase and provides the selected clock signal SELECTED CLOCK to synchronizer 130 via path 138. The signal SELECTED CLOCK is used to receive the input data into circuit 118. Corresponding output data is provided to synchronizer 130 via path 124. The phase-aligned output data from the synchronizer output is provided to data realigner 156 via path 146 and multiplexer 132. Multiplexer 154 is used to route the signal SERIAL CLOCK to the clock input of data realigner 156. Multiplexer 158 is used to route the SERIAL CLOCK signal to the serial clock input of deserializer 164. The signal REFERENCE CLOCK is forwarded on lines 114 and 86 by phase-locked-loop circuit 114 as the signal PARALLEL CLOCK. The forwarded PARALLEL CLOCK signal may be uses by user-defined programmable logic (user logic). Multiplexer 160 is used to route the signal PARALLEL CLOCK to the parallel clock input of deserializer 164. Deserializer 164 performs serial-to-parallel conversion on the data received from data realigner 156 and provides corresponding parallel data on output 76.

In soft clock data recovery mode (SC), the transmitter clock and the receiver clock may have slightly different rates. This discrepancy may arise, for example, because the transmitter clock and the receiver clock are derived from different oscillating crystals (e.g., oscillators on different boards in a system). Because the clock rates at the transmitter and receiver are not exactly the same, the programmable logic 18 in device 10 is configured to implement the rate matching FIFO 78 of circuit 66 (FIG. 3). The rate matching FIFO 78 is used to perform both phase-alignment and rate matching operations. Because phase alignment is handled by rate matching FIFO 78, it is not necessary to perform phase alignment using synchronizer 130 of FIG. 4. Accordingly, synchronizer 130 is bypassed.

During soft clock data recovery mode, input data is received by circuit 118 via path 120. Phase-locked-loop circuit 114 receives a reference clock signal on path 90 and generates a corresponding multiphase DPA clock on path 116. Dynamic phase alignment phase detection and recovery circuit 118 receives the DPA clock and selects the optimal phase for receiving the input data on path 120. The selected phase is output as signal SELECTED CLOCK on line 122. The processed output data is provided on path 124. Multiplexer 132 is configured to route the output data on path 124 to the input of data realigner 156. The SELECTED CLOCK signal is passed to the clock input of data realigner 156 via multiplexer 154. Clock divider 162 divides the signal SERIAL CLOCK to produce the signal RECOVERED CLOCK on lines 84 and 166. Multiplexer 160 is configured to route the clock output from clock divider 162 to the parallel clock input of deserializer 164. The signal SELECTED CLOCK is routed to the serial clock input of deserializer 164 via multiplexer 158. Deserializer 164 provides parallel data corresponding to the serial data received from data realigner 156 to circuit 66 (FIG. 3) via path 76. The PARALLEL CLOCK signal on path 86 and the RECOVERED CLOCK signal on path 84 are provided to FIFO (FIG. 3).

In the phase-locked-loop source synchronous modes, dynamic phase alignment circuits are grouped together in a master-slave architecture. With one illustrative arrangement, each bus of transmitted data includes four data paths and a clock signal path. To handle received data for each bus, a master dynamic phase alignment circuit is grouped with four associated slave dynamic phase alignment circuits. The master dynamic phase alignment circuit is used to identify an optimal clock phase to use in receiving data for the bus. The master dynamic phase alignment circuit distributes the selected optimal clock phase to the slave circuits, which use the selected optimal clock phase in receiving and processing the data from the bus.

Figure 7:
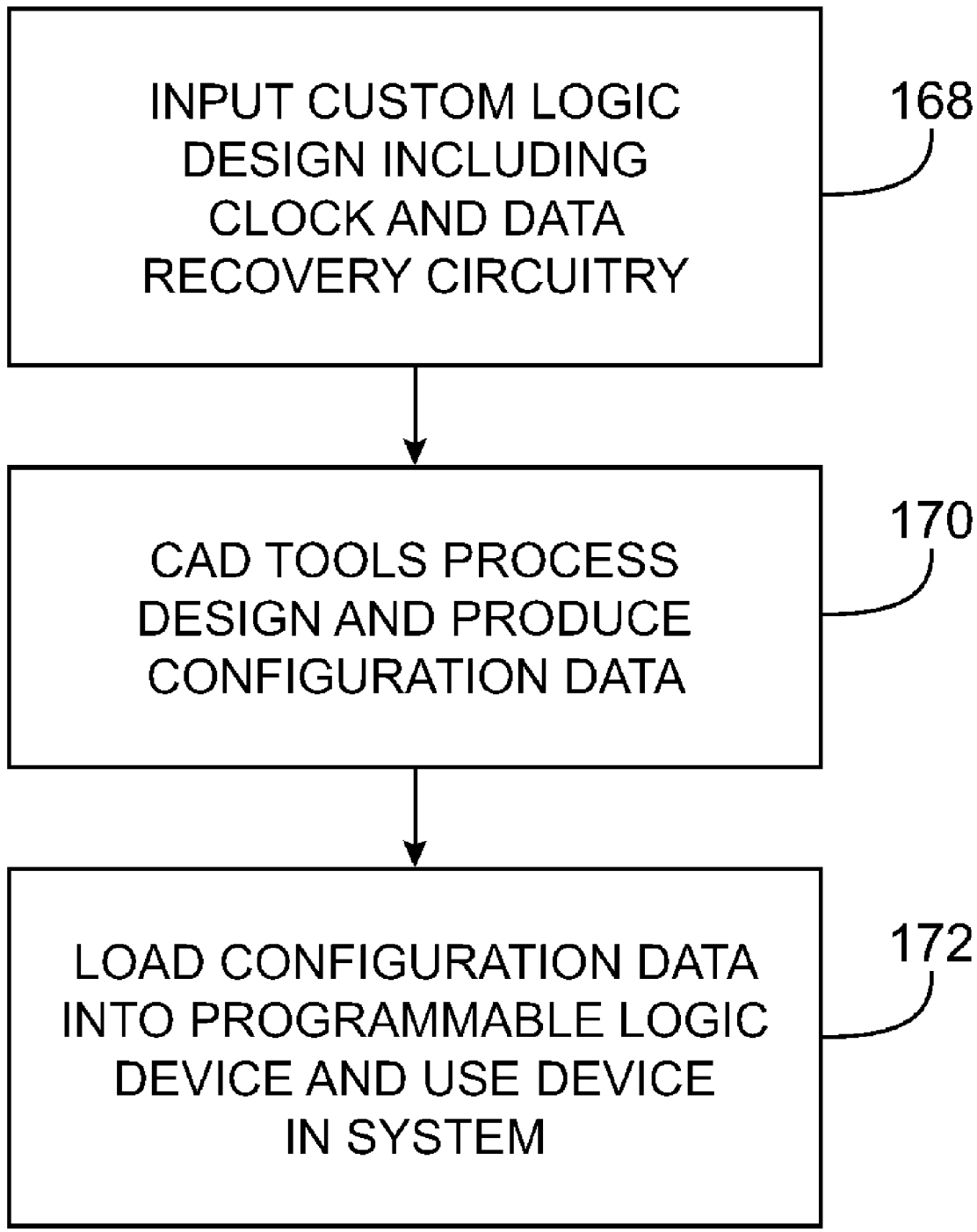
FIG. 7 is a flow chart of illustrative steps involved in programming and using a programmable logic device integrated circuit with transceiver circuitry in accordance with the present invention.

Illustrative steps involved in configuring and using a programmable logic device 10 with transceiver circuitry of the type shown in FIGS. 3 and 4 are shown in FIG. 7.

At step 168, a user (e.g., a logic designer) creates a custom logic design for a programmable logic device 10 using logic design system 56 (FIG. 2). During the design process, the user decides whether or not some or all of the transceivers 62 on the programmable logic device 10 will need clock and data recovery features such as rate matching. If clock rate matching functionality is needed to support system design constraints, the logic design that is created at step 168 includes a design for circuitry such as the circuit 66 of FIG. 3. For example, the circuit design that is created includes a rate matching FIFO 78. If desired, various designs for circuit 66 may be maintained in a design library. The logic designer can create the design by copying all or part of the design for circuit 66 from the library.

At step 170, the computer-aided-design (CAD) tools on logic design system 56 process the user's design and produce corresponding configuration data.

At step 172, the configuration data is loaded into a programmable logic device and the programmable logic device is used in a system, as described in connection with FIG. 2. During operation in a system, the configuration data (or dynamic control signals from programmable logic 18 on the device 10) configures the adjustable circuitry in transceiver 62 so that the transceiver operates in its desired mode (i.e., normal source synchronous mode, normal dynamic phase alignment mode, soft clock data recovery mode, or phase-locked-loop source synchronous mode).

The foregoing is merely illustrative of the principles of this invention and various modifications can be made by those skilled in the art without departing from the scope and spirit of the invention.

What is claimed is:

1. A transceiver circuitry, comprising:
a dynamic phase alignment circuit that uses a selected clock phase of a multiphase dynamic phase alignment clock to capture serial data received from an integrated circuit, that converts the serial data to parallel data, and that divides the selected clock phase to produce a recovered clock,
wherein the dynamic phase alignment circuit comprises a dynamic phase alignment phase detection and recovery circuit and a synchronizer and is configured to operate in first, second, and third modes of operations, wherein:
in the third mode of operation, the serial data passes through the dynamic phase alignment phase detection and recovery circuit and the synchronizer;
in the second mode of operation, the serial data passes through the dynamic phase alignment phase detection and recovery circuit without passing through the synchronizer; and
in the first mode of operation, the serial data is deserialized while bypassing the dynamic phase alignment phase detection and recovery circuit and bypasses the synchronizer.

2. The transceiver circuitry defined in claim 1, further comprising programmable logic configured as a rate matching first-in-first-out circuit having a write clock input that receives the recovered clock, having an input that receives the parallel data in the second mode of operation, having a read clock input that receives a parallel clock from the dynamic phase alignment circuit, and having an output at which a version of the parallel data is provided that is rate-matched and phase-aligned to the parallel clock.

3. The transceiver circuitry defined in claim 2 further comprising:
a word aligner configured from programmable logic, wherein the word aligner receives the parallel data from the dynamic phase alignment circuit and provides the parallel data to the programmable logic configured as the rate matching first-in-first-out circuit; and
a data realigner in the dynamic phase alignment circuit that has a first input that receives the captured serial data, a second input, and an output, wherein the word aligner generates a control signal that is received at the second input of the data realigner to direct the data realigner to selectively drop bits in the captured serial data when needed to maintain word alignment in the parallel data.

4. The transceiver circuitry defined in claim 2 wherein the dynamic phase alignment circuit comprises a phase-locked-loop circuit that receives a reference clock and that produces the parallel clock from the reference clock.

5. The transceiver circuitry defined in 2,
wherein the dynamic phase alignment phase detection and recovery circuit selects the selected clock phase from among multiple clock phases in the multiphase dynamic phase alignment clock and
wherein the synchronizer receives the selected clock from the dynamic phase alignment phase detection and recovery circuit.

6. The transceiver circuitry defined in claim 2 wherein the dynamic phase alignment circuit comprises:
a phase-locked-loop circuit that receives a reference clock and that produces the parallel clock and the multiphase dynamic phase alignment clock from the reference clock,
wherein the dynamic phase alignment phase detection and recovery circuit receives the multiphase dynamic phase alignment clock from the phase-locked-loop circuit and selects the selected clock phase from among multiple clock phases in the multiphase dynamic phase alignment clock
and wherein the synchronizer receives the selected clock from the dynamic phase alignment phase detection and recovery circuit.

7. The transceiver circuitry defined in claim 2 wherein the dynamic phase alignment circuit comprises:
a data input at which the serial data is received from the integrated circuit;
a phase-locked-loop circuit that receives a reference clock and that produces the parallel clock and the multiphase dynamic phase alignment clock from the reference clock,
wherein the dynamic phase alignment phase detection and recovery circuit receives the multiphase dynamic phase alignment clock from the phase-locked-loop circuit, selects the selected clock phase from among multiple clock phases in the multiphase dynamic phase alignment clock, and receives the serial data from the data input
and wherein the synchronizer receives the selected clock from the dynamic phase alignment phase detection and recovery circuit at a clock input and receives the serial data from the dynamic phase alignment phase detection and recovery circuit.

8. The transceiver circuitry defined in claim 2 wherein the dynamic phase alignment circuit comprises:
a data input at which the serial data is received from the integrated circuit;
a deserializer that generates the parallel data from the serial data;
a multiplexer through which the serial data is provided to the deserializer, wherein the multiplexer has at least first and second inputs and an output;
a phase-locked-loop circuit that receives a reference clock and that produces the parallel clock and the multiphase dynamic phase alignment clock from the reference clock,
wherein the dynamic phase alignment phase detection and recovery circuit receives the multiphase dynamic phase alignment clock from the phase-locked-loop circuit, selects the selected clock phase from among multiple clock phases in the multiphase dynamic phase alignment clock, has an input coupled to the data input for receiving the serial data from the data input, and has an output, wherein the first input of the multiplexer is coupled to the data input and receives the serial data from the data input in the first mode of operation and wherein the second input of the multiplexer is coupled to the output of the dynamic phase detection and recovery circuit and receives the serial data in the second mode of operation.

9. The transceiver circuitry defined in claim 2 wherein the dynamic phase alignment circuit comprises:
a data input at which the serial data is received from the integrated circuit;
a deserializer that generates the parallel data from the serial data;

a multiplexer through which the serial data is provided to the deserializer, wherein the multiplexer has at least first and second inputs and an output;

a phase-locked-loop circuit that receives a reference clock and that produces the parallel clock and the multiphase dynamic phase alignment clock from the reference clock, wherein the dynamic phase alignment phase detection and recovery circuit receives the multiphase dynamic phase alignment clock from the phase-locked-loop circuit, selects the selected clock phase from among multiple clock phases in the multiphase dynamic phase alignment clock, has an input coupled to the data input for receiving the serial data from the data input, and has an output, wherein the first input of the multiplexer is coupled to the data input and receives the serial data from the data input in the first mode of operation and wherein the second input of the multiplexer is coupled to the output of the dynamic phase detection and recovery circuit and receives the serial data in the second mode of operation and wherein the synchronizer receives the selected clock from the dynamic phase alignment phase detection and recovery circuit at a clock input and receives the serial data from the output of the dynamic phase alignment phase detection and recovery circuit in the third mode of operation.

10. The transceiver circuitry defined in claim 2 wherein the dynamic phase alignment circuit comprises:

a data input at which the serial data is received from the integrated circuit;

a deserializer that generates the parallel data from the serial data;

a multiplexer through which the serial data is provided to the deserializer, wherein the multiplexer has at least first and second inputs and an output;

a phase-locked-loop circuit that receives a reference clock and that produces the parallel clock and the multiphase dynamic phase alignment clock from the reference clock, wherein the dynamic phase alignment phase detection and recovery circuit receives the multiphase dynamic phase alignment clock from the phase-locked-loop circuit, selects the selected clock phase from among multiple clock phases in the multiphase dynamic phase alignment clock, has an input coupled to the data input for receiving the serial data from the data input, and has an output, wherein the first input of the multiplexer is coupled to the data input and receives the serial data from the data input in the first mode of operation and wherein the second input of the multiplexer is coupled to the output of the dynamic phase detection and recovery circuit and receives the serial data in the second mode of operation, and wherein the synchronizer receives the selected clock from the dynamic phase alignment phase detection and recovery circuit at a clock input and receives the serial data from the output of the dynamic phase alignment phase detection and recovery circuit in the third mode of operation; and a data realigner that has a first input that receives the serial data after the serial data has passed through the multiplexer, a second input, and an output through which the data realigner provides the serial data to the deserializer, wherein a control signal that is received at the second input of the data realigner directs the data realigner to selectively drop bits in the serial data when needed to maintain word alignment in the parallel data.

11. The transceiver circuitry defined in claim 2 further comprising:

a word aligner configured from programmable logic, wherein the word aligner receives the parallel data from the dynamic phase alignment circuit and provides the parallel data to the programmable logic that is configured as the rate matching first-in-first-out circuit, wherein the dynamic phase alignment circuit comprises:

a data input at which the serial data is received from the integrated circuit;

a deserializer that generates the parallel data from the serial data;

a multiplexer through which the serial data is provided to the deserializer, wherein the multiplexer has at least first and second inputs and an output;

a phase-locked-loop circuit that receives a reference clock and that produces the parallel clock and the multiphase dynamic phase alignment clock from the reference clock, wherein the dynamic phase alignment phase detection and recovery circuit receives the multiphase dynamic phase alignment clock from the phase-locked-loop circuit, selects the selected clock phase from among multiple clock phases in the multiphase dynamic phase alignment clock, has an input coupled to the data input for receiving the serial data from the data input, and has an output, wherein the first input of the multiplexer is coupled to the data input and receives the serial data from the data input in the first mode of operation and wherein the second input of the multiplexer is coupled to the output of the dynamic phase detection and recovery circuit and receives the serial data in the second mode of operation, and wherein the synchronizer receives the selected clock from the dynamic phase alignment phase detection and recovery circuit at a clock input and receives the serial data from the output of the dynamic phase alignment phase detection and recovery circuit in the third mode of operation; and a data realigner that has a first input that receives the serial data after the serial data has passed through the multiplexer, a second input, and an output through which the data realigner provides the serial data to the deserializer, wherein the word aligner generates a control signal that is received at the second input of the data realigner to direct the data realigner to selectively drop bits in the serial data when needed to maintain word alignment in the parallel data.

12. The transceiver circuitry defined in 2, wherein the synchronizer has a data input to which the serial data from the integrated circuit is provided and has a data output, the transceiver circuitry further comprising:

a deserializer that generates the parallel data from the serial data; and a multiplexer through which the serial data is provided to the deserializer, wherein the multiplexer has one input coupled to the data input of the synchronizer and another input coupled to the data output of the synchronizer.

13. The transceiver circuitry defined in claim 2, wherein the dynamic phase alignment phase detection and recovery circuit receives the multiphase dynamic phase alignment clock, selects the selected clock phase from among multiple clock phases in the multiphase dynamic phase alignment clock, receives the serial data from the integrated circuit, and has an output at which the serial data is provided and wherein the synchronizer that has a data input to which the serial data from the output of the dynamic phase alignment phase detection and recovery circuit is provided and that has a data output, the transceiver circuitry further comprising:

a deserializer that generates the parallel data from the serial data; and a multiplexer through which the serial data is provided to the deserializer, wherein the multiplexer has one input coupled to the data input of the synchronizer and another input coupled to the data output of the synchronizer.

14. The transceiver circuitry defined in 2 further comprising:

a phase-locked-loop circuit that receives a reference clock and that produces the parallel clock and the multiphase dynamic phase alignment clock from the reference clock, wherein the dynamic phase alignment phase detection and recovery circuit receives the multiphase dynamic phase alignment clock from the phase-locked-loop circuit, selects the selected clock phase from among multiple clock phases in the multiphase dynamic phase alignment clock, has an input that receives the serial data from the integrated circuit, and has an output at which the serial data is provided and wherein the synchronizer has a data input to which the serial data from the output of the dynamic phase alignment phase detection and recovery circuit is provided and that has a data output;

a deserializer that generates the parallel data from the serial data; and a multiplexer through which the serial data is provided to the deserializer, wherein the multiplexer has one input coupled to the data input of the synchronizer and another input coupled to the data output of the synchronizer.

15. The transceiver circuitry defined in claim 2 further comprising:

a phase-locked-loop circuit that receives a reference clock, that produces a serial clock from the reference clock, that produces the parallel clock from the reference clock, and that produces the multiphase dynamic phase alignment clock from the reference clock, wherein the dynamic phase alignment phase detection and recovery circuit receives the multiphase dynamic phase alignment clock from the phase-locked-loop circuit, selects the selected clock phase from among multiple clock phases in the multiphase dynamic phase alignment clock, has an input that receives the serial data from the integrated circuit, and has an output at which the serial data is provided and wherein the synchronizer has a data output, has a data input to which the serial data from the output of the dynamic phase alignment phase detection and recovery circuit is provided, has a write clock input that receives the selected clock phase from the dynamic phase alignment phase detection and recovery circuit, and has a read clock input that receives the serial clock from the phase-locked-loop circuit;

a deserializer that generates the parallel data from the serial data; and a multiplexer through which the serial data is provided to the deserializer, wherein the multiplexer has one input coupled to the data input of the synchronizer and another input coupled to the data output of the synchronizer.

16. A programmable logic device integrated circuit, comprising:

a dynamic phase alignment circuit that converts serial data into parallel data, wherein the dynamic phase alignment circuit comprises:

a dynamic phase alignment phase detection and recovery circuit that selects a dynamic phase alignment clock phase from a multiphase dynamic phase alignment clock a synchronizer; and multiplexing circuitry that is switched to configure the dynamic phase alignment circuit in at least first, second, and third modes of operation, wherein in the third mode of operation the multiplexing circuitry routes the serial data through the dynamic phase alignment phase detection and recovery circuit and the synchronizer, wherein in the second mode of operation the multiplexing circuitry routes the serial data through the dynamic phase alignment phase detection and recovery circuit and bypasses the synchronizer, and wherein in the first mode of operation the multiplexing circuitry routes the serial data so that the serial data bypasses the dynamic phase alignment phase detection and recovery circuit and bypasses the synchronizer.

17. The programmable logic device integrated circuit defined in claim 16 further comprising programmable logic configured to form a rate-matching first-in-first-out circuit that receives the parallel data from the dynamic phase alignment circuit and that rate matches and phase matches the parallel data to a given clock signal.

18. The programmable logic device integrated circuit defined in claim 17 wherein the dynamic phase alignment circuit comprises:

a dynamic phase alignment phase detection and recovery circuit that selects a dynamic phase alignment clock phase from a multiphase dynamic phase alignment clock, wherein the synchronizer has a data input that receives the serial data from another integrated circuit and has a data output, wherein the multiplexing circuitry comprises a multiplexer having at least first and second inputs and an output, wherein the first input of the multiplexer is coupled to the data input of the synchronizer, wherein the second input of the multiplexer is coupled to the data output of the synchronizer, and wherein the serial data is passed from a selected one of the at least first and second inputs to the output of the multiplexer.

19. The programmable logic device integrated circuit defined in claim 17 wherein the dynamic phase alignment circuit comprises:

a deserializer that converts the serial data into the parallel data;

a dynamic phase alignment phase detection and recovery circuit that selects a dynamic phase alignment clock phase from a multiphase dynamic phase alignment clock, wherein the synchronizer has a data input that receives the serial data from another integrated circuit and that has a data output, wherein the multiplexing circuitry comprises a multiplexer having at least first and second inputs and an output, wherein the first input of the multiplexer is coupled to the data input of the synchronizer, wherein the second input of the multiplexer is coupled to the data output of the synchronizer, wherein the output of the multiplexer is coupled to the deserializer, and wherein the serial data is passed from a selected one of the first and second inputs to the deserializer through the output of the multiplexer.

20. The programmable logic device integrated circuit defined in claim 17 wherein the dynamic phase alignment circuit comprises:

a data input through which the dynamic phase alignment circuit receives the serial data from another integrated circuit, wherein the dynamic phase alignment phase detection and recovery circuit selects a dynamic phase alignment clock phase from a multiphase dynamic phase alignment clock and wherein the synchronizer has a write clock input to which the selected clock phase from the dynamic phase alignment phase detection and recovery circuit is provided and has a read clock input;

a phase-locked-loop circuit that produces the multiphase dynamic phase alignment clock;

a data realigner that selectively drops bits from the serial data in response to control signals; and a deserializer that receives the serial data from the data realigner and that converts the serial data into the parallel data for the rate-matching first-in-first-out circuit wherein in the first mode of operation the serial data is routed by the multiplexing circuitry directly from the data input of the dynamic phase alignment circuit to the data realigner, wherein in the second mode of operation the multiplexing circuitry bypasses the synchronizer and the serial data is routed from the dynamic phase alignment phase detection and recovery circuitry to the data realigner, and wherein in the third mode of operation the serial data flows through the synchronizer and is routed by the multiplexing circuitry from the synchronizer to the data realigner.

21. A dynamic phase alignment circuit comprising:

a phase-locked-loop circuit that receives a reference clock as an input and that provides as outputs a multiphase dynamic phase alignment clock, a serial clock, and a parallel clock;

a dynamic phase alignment phase detection and recovery circuit that receives the multiphase dynamic phase alignment clock over a clock bus and that provides a selected clock phase at an output;

a synchronizer having a write clock input that receives the selected clock phase and having a read clock input that receives the serial clock;

a bypass multiplexer that receives data that has been read from the synchronizer in a first mode of operation and that bypasses the synchronizer in a second mode of operation;

a deserializer that performs serial-to-parallel conversion operations on data that has passed through the bypass multiplexer, wherein the deserializer has a serial clock input and a parallel clock input;

a clock divider that divides the selected clock phase to produce a recovered clock signal; and a multiplexer that applies the parallel clock from the phase-locked-loop circuit to the parallel clock input of the deserializer in the first mode of operation and that applies the recovered clock signal from the clock divider to the parallel clock input of the deserializer in the second mode of operation.

* * * * *